(12) United States Patent
Liu et al.

(10) Patent No.: US 9,843,313 B2
(45) Date of Patent: Dec. 12, 2017

(54) APPARATUS AND METHOD FOR VOLTAGE ALTERNATING PULSE OUTPUT

(71) Applicants: Nuctech Company Limited, Beijing (CN); Tsinghua University, Beijing (CN)

(72) Inventors: Yaohong Liu, Beijing (CN); Chuanxiang Tang, Beijing (CN); Xinshui Yan, Beijing (CN); Wei Jia, Beijing (CN); Jianjun Gao, Beijing (CN); Jinsheng Liu, Beijing (CN); Wei Yin, Beijing (CN); Xiying Liu, Beijing (CN); Hao Shi, Beijing (CN)

(73) Assignees: Nuctech Company Limited, Beijing (CN); Tsinghua University, Beijing (CN)

( * ) Notice: Subject to any disclaimer, the term of this patent is extended or adjusted under 35 U.S.C. 154(b) by 618 days.

(21) Appl. No.: 14/116,074

(22) PCT Filed: Dec. 28, 2012

(86) PCT No.: PCT/CN2012/001753
§ 371 (c)(1),
(2) Date: Nov. 6, 2013

(87) PCT Pub. No.: WO2013/097299
PCT Pub. Date: Jul. 4, 2013

(65) Prior Publication Data
US 2014/0077619 A1    Mar. 20, 2014

(30) Foreign Application Priority Data
Dec. 31, 2011   (CN) .......................... 2011 1 0457579

(51) Int. Cl.
*H03K 3/57* (2006.01)
*H03K 3/64* (2006.01)
(Continued)

(52) U.S. Cl.
CPC .............. *H03K 3/57* (2013.01); *H02M 1/088* (2013.01); *H03K 3/64* (2013.01); *H02M 2003/077* (2013.01)

(58) Field of Classification Search
CPC .. H02M 1/088; H02M 2003/077; H03K 3/57; H03K 3/64; H03K 3/53; H03K 3/45;
(Continued)

(56) References Cited

U.S. PATENT DOCUMENTS

2006/0245217 A1* 11/2006 Kirbie ...................... H03K 3/57
363/60
2009/0316438 A1* 12/2009 Crewson .............. H03K 17/127
363/16
(Continued)

FOREIGN PATENT DOCUMENTS

CN          1155180 A      7/1997
CN         102067449 A     5/2011
(Continued)

OTHER PUBLICATIONS

International Search Report for PCT/CN2012/001753, dated Mar. 28, 2013, 3 pages.
(Continued)

*Primary Examiner* — Zeev V Kitov
*Assistant Examiner* — Brian K Baxter
(74) *Attorney, Agent, or Firm* — Withrow & Terranova, P.L.L.C.

(57) ABSTRACT

The present invention provides a high voltage pulse modulating power source based on alternate group triggering, which comprises: a DC stabilized voltage source for supplying power to the high voltage pulse modulating power source; a plurality of solid-state switches; a plurality of triggers corresponding to said plurality of solid-state switches, wherein each trigger provides a trigger signal to its
(Continued)

corresponding solid-state switch to turn on said corresponding solid-state switch, wherein said plurality of triggers are divided into at least two groups of triggers; a time sequence control module, which, at time t1, controls said plurality of triggers to generate trigger signals so as to turn on said plurality of solid-state switches simultaneously, and at time t2, controls one group of said at least two groups of triggers to generate trigger signals to turn on solid-state switches corresponding to this group of triggers, wherein time t1 and time t2 appear alternately.

10 Claims, 5 Drawing Sheets

(51) Int. Cl.
*H02M 1/088* (2006.01)
*H02M 3/07* (2006.01)

(58) Field of Classification Search
CPC ...... H03K 3/537; H03K 3/55; H05B 33/0815; H05B 33/0818; H05B 41/2828; H05B 41/3921; H05B 41/3927; H01S 3/113; H01S 3/117; H01S 3/115; H01S 3/0627; H01S 3/0941; H01S 3/109; H01S 3/09415; H01S 3/107; H01S 5/06213; H01S 5/0427; H01S 5/06832; G02F 1/37; G02F 1/3534; G02F 1/39; H04B 10/504
USPC ............... 307/106; 372/26, 10, 21; 315/291
See application file for complete search history.

(56) References Cited

U.S. PATENT DOCUMENTS

| 2011/0215791 | A1* | 9/2011 | Chen | H03K 3/57 323/351 |
| 2012/0223583 | A1* | 9/2012 | Cooley | H02J 3/385 307/82 |
| 2012/0326528 | A1* | 12/2012 | Chen | H03K 7/08 307/108 |
| 2014/0320105 | A1* | 10/2014 | Liu | H03K 7/08 323/311 |

FOREIGN PATENT DOCUMENTS

| CN | 102545687 A | 7/2012 |
| CN | 202406058 U | 8/2012 |
| JP | 2005237147 A | 9/2005 |
| WO | 2011146498 A2 | 11/2011 |

OTHER PUBLICATIONS

Written Opinion for International Patent Application No. PCT/CN2012/001753, dated Mar. 28, 2013, 12 pages.
Office Action for Chinese Patent Application No. 201110457579.0, dated Aug. 2, 2013, 7 pages.
Extended European Search Report for European Patent Application No. 12862988.6, dated May 27, 2016, 7 pages.

* cited by examiner

APPARATUS AND METHOD FOR VOLTAGE ALTERNATING PULSE OUTPUT

This application is a 35 USC 371 national phase filing of International application number PCT/CN2012/001753, filed Dec. 28, 2012, which claims priority to Chinese national application 201110457579.0, filed Dec. 31, 2011, the disclosures of which are incorporated herein by reference in their entireties.

FIELD OF THE INVENTION

The present invention relates generally to voltage alternating pulse output. More specifically, the present invention relates to a technique realizing double (multiple)-voltage alternating pulse output on a solid-state pulse modulating power source based on a MARX generator principle.

BACKGROUND OF THE INVENTION

A MARX generator is a way of realizing a pulse modulating power source, and it is a device that is charged in parallel and then discharged in series using capacitance. The MARX generator can realize nanosecond narrow pulse and a very high pulse frequency. A solid-state pulse modulating power source is a power source that uses a is solid-state switch, e.g. IGBT (Insulating Gate Bi-polar Transistor), to perform pulse modulation.

Modulators widely used in the field of dual-energy accelerator at present are mostly linear modulators. In linear modulators, an alternating dual-energy pulse supplying can be realized through adjusting the charging voltages of two adjacent pulses. Accelerators using solid-state pulse modulators are mostly single-energy accelerators, and at present, the solid-state pulse modulating power sources that are based on the MARX generator principle and are applied to linear accelerators usually work in such a way as that all of the IGBTs are triggered simultaneously.

Hence, there is a need to realize double (multiple)-voltage alternating output on solid-state pulse modulating power sources based on the MARX generator principle, and to apply it to electronic linear accelerators capable of alternating dual-energy beam emitting.

SUMMARY OF THE INVENTION

The present invention provides an apparatus and method for outputting voltage alternating pulses through alternate group triggering.

According to one aspect of the present invention, a high voltage pulse modulating power source based on alternate group triggering is provided, which comprises: a DC stabilized voltage source for supplying power to the high voltage pulse modulating power source; a plurality of solid-state switches; a plurality of triggers corresponding to said plurality of solid-state switches, wherein each trigger provides a trigger signal to its corresponding solid-state switch to turn on said corresponding solid-state switch, wherein said plurality of triggers are divided into at least two groups of triggers; a time sequence control module, which, at time t1, controls said plurality of triggers to generate trigger signals so as to turn on said plurality of solid-state switches simultaneously, and at time t2, controls one group of said at least two groups of triggers to generate trigger signals to turn on solid-state switches corresponding to this group of triggers, wherein time t1 and time t2 appear alternately.

According to another aspect of the present invention, the high voltage pulse modulating power source further comprises a voltage reducing device, which separately supplies power for one or more of said plurality of solid-state switches.

According to still another aspect of the present invention, a method for alternate group triggering of a high voltage pulse modulating power source is provided, said high voltage pulse modulating power source comprising a plurality of solid-state switches, said method comprises the steps of: dividing said plurality of solid-state switches into at least two groups; providing trigger signals to said plurality of solid-state switches at time t1 to turn on them simultaneously; and providing trigger signals to one group of said at least two groups of solid-state switches at time t2 to turn on this group of solid-state switches, wherein time t1 and time t2 appear alternately.

According to yet another aspect of the present invention, said method also separately supplies power for one or more of said plurality of solid-state switches.

In a preferred embodiment of the present invention, double (multiple)-voltage alternating output is realized on solid-state pulse modulating power sources based on the MARX generator principle, which is applied to electronic linear accelerators capable of alternating dual-energy beam emitting.

By means of the present invention, a single-energy accelerator can be used for realizing double (multiple)-voltage alternating output through alternate group triggering.

BRIEF DESCRIPTION OF THE DRAWINGS

In order to facilitate a full understanding of the present invention, descriptions are given below in conjunctions with the drawings, wherein.

DETAILED DESCRIPTION OF THE INVENTION

FIGS. 1-5 discussed in the present invention and the various embodiments for describing the principle of the present invention in said patent document are only for the purpose of illustration, but they should not be construed as limiting the scope of the present invention in any way. Those skilled in the art shall understand that the principle of the present invention can be realized through any type of apparatus or system arranged properly.

Figure 1:
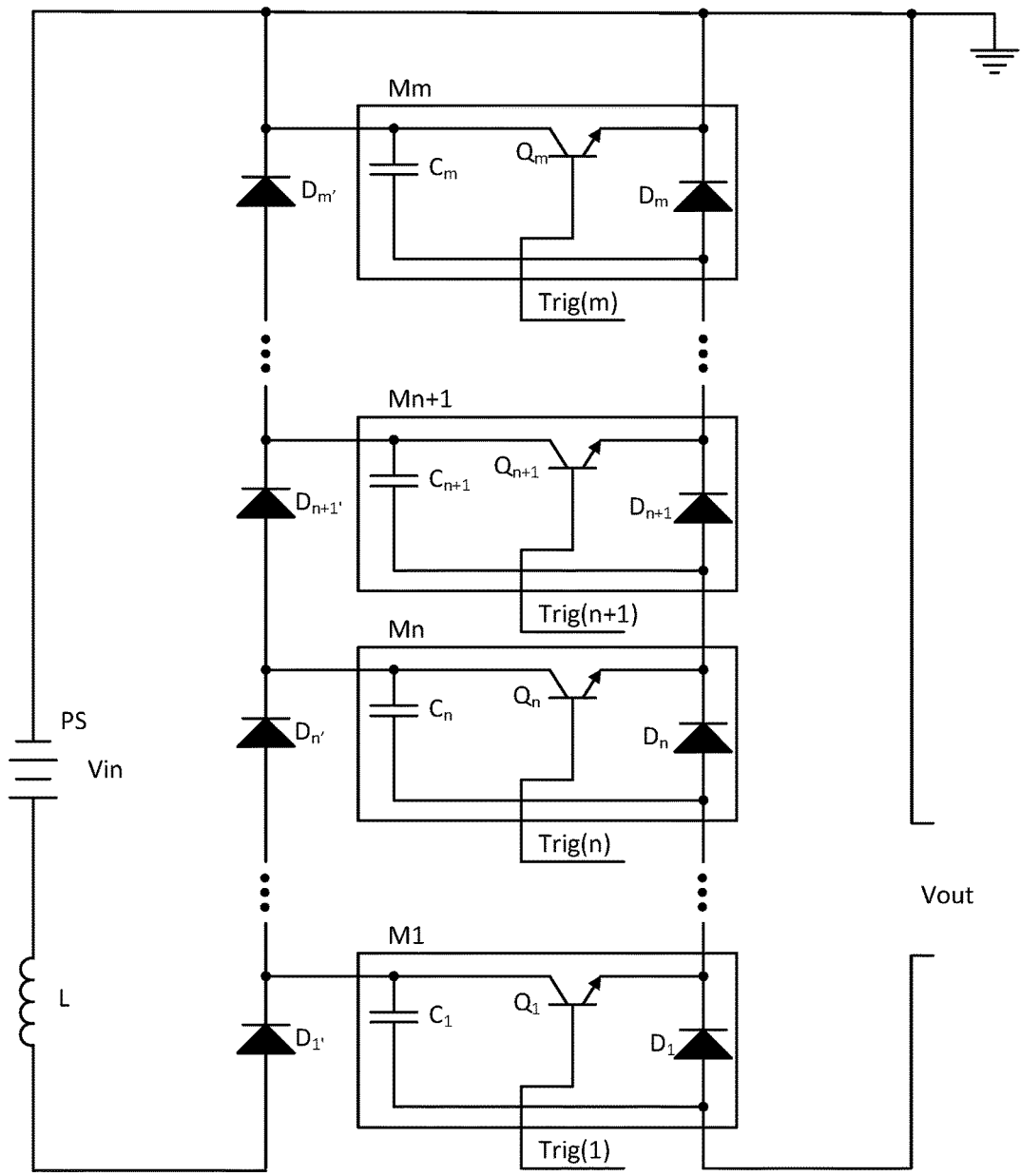
FIG. 1 is a schematic drawing of the principle of the high voltage pulse modulating power source based on the MARX generator.

FIG. 1 is a schematic drawing of the principle of the high voltage pulse modulating power source based on the MARX generator. In the figure, PS represents a high power DC stabilized voltage source, which is the power supply for the high voltage pulse modulating power source, and the supply voltage is Vin. M1~Mm are m IGBT modular units. Trig(1)

~Trig(m) are trigger signals corresponding to IGBT module groups. Vout is a voltage of the output terminal of the high voltage pulse modulating power source.

During an interval of two times of triggering, the PS charges a capacitor C in an IGBT modular unit through a charging inductance L and a diode, thereby forming a capacitor array of parallel charging, and the voltage on the capacitor C is kept to be Vin until the next triggering comes. When the triggering comes, each of the IGBT modules is turned on, and the capacitors C on the modules form a series discharging loop through each IGBT modular unit, and the output voltage of the high voltage pulse modulating power source at the time is Vout=n*Vin, wherein n is a number of IGBT modules that is turned on currently.

Figure 2:
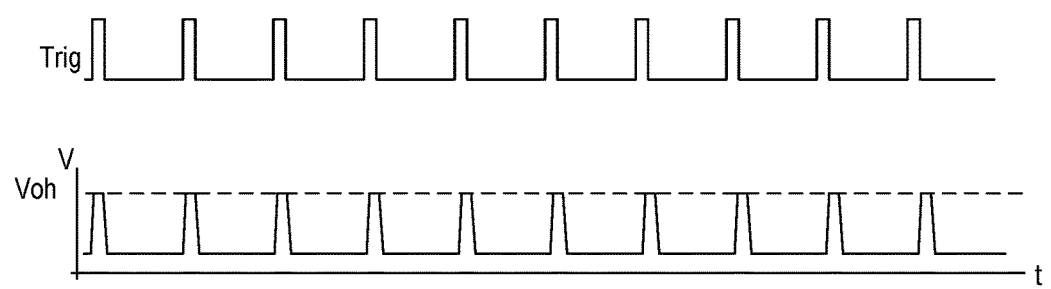
FIG. 2 is a schematic drawing of the work schedule of the high voltage pulse modulating power source based on the MARX generator.

FIG. 2 is a schematic drawing of the work schedule of the high voltage pulse is modulating power source based on the MARX generator. As shown in FIG. 2, a trigger signal Trig is generated when a trigger time t comes, and a high output terminal voltage Voh is obtained in a way that the high voltage pulse modulating power source based on the MARX generator principle makes all solid-state switches (e.g. IGBTs) being triggered simultaneously by the trigger signal Trig.

Figure 3:
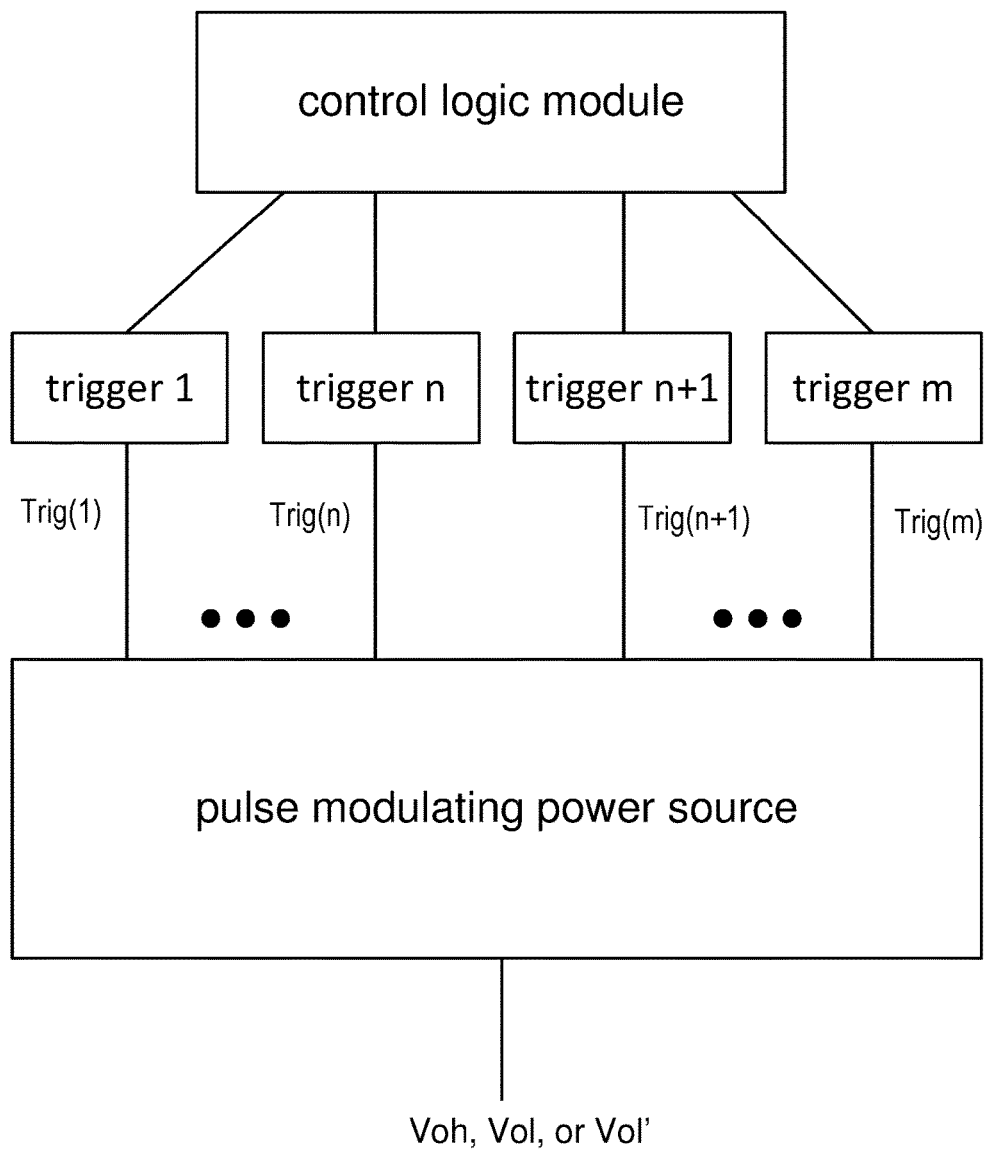
FIG. 3 is a schematic drawing of the high voltage pulse modulating power source is according to one embodiment of the present invention.

FIG. 3 is a schematic drawing of the high voltage pulse modulating power source according to one embodiment of the present invention. The high voltage pulse modulating power source shown in FIG. 3 is, for example, a typical high voltage pulse modulating power source based on the MARX generator as shown in FIG. 1, wherein m triggers (trigger 1 . . . , trigger n, trigger n+1, . . . trigger m) provide trigger signals Trig(1), . . . Trig(n), Trig(n+1) . . . Trig(m) to the high voltage pulse modulating power source. In a preferred embodiment, triggers 1~m can be divided into two groups, i.e. triggers 1~n and triggers n+1~m. In another preferred embodiments, triggers 1~m may be divided into more than two groups. Triggers 1~m are controlled by a time sequence control module. The time sequence control module controls the trigger signals Trig(1)~Trig(m) generated by triggers 1~m so as to turn on m IGBT modular units in the high voltage pulse modulating power source group by group.

In a preferred embodiment, triggers 1~m are divided into two groups, i.e. triggers 1~n and triggers n+1~m. At time t1, the time sequence control module controls triggers 1~m to generate trigger signals Trig(1)~Trig(n) simultaneously, so that two groups of IGBT modules M1~Mm corresponding to the two groups of triggers are triggered simultaneously, thus obtaining a high output terminal voltage Voh:

$Voh=m*Vin.$

At time t2, the time sequence control module controls the first group of triggers 1~n to generate a first group of trigger signals Trig(1)~Trig(n), and controls the second group of triggers n+1~m to not generate trigger signals, so that the first group of IGBT modules M1~Mn corresponding to the first group of trigger signals Trig(1)~Trig(n) are triggered, while the second group of IGBT modules Mn+1~Mm corresponding to the is second group of triggers n+1~m are not triggered, thereby obtaining a low output terminal voltage vol:

$Vol=n*Vin.$

Alternatively, at time t2, the time sequence control module controls the second group of triggers n+1~m to generate a second group of trigger signals Trig(n+1)~Trig(m), and controls the first group of triggers 1~n to not generate trigger signals, so that the first group of IGBT modules M1~Mn corresponding to the first group of trigger signals Trig(1)~Trig(n) are not triggered, while the second group of IGBT modules Mn+1~Mm corresponding to the second group of triggers n+1~m are triggered, thereby obtaining a low output terminal voltage Vol':

$Vol'=(m-n)*Vin.$

Time t1 and time t2 appear alternately, forming a dual voltage pulse power source whose output voltage Voh alternates with Vol or with Vol'.

In another preferred embodiment, triggers 1~m can be divided into more than two groups, e.g. three groups. The time sequence controller can control all three groups of triggers to generate trigger signals at time t1, and control two of the three groups of triggers to generate trigger signals and the rest group of triggers to not generate trigger signals at time t2, and control one of the three groups of triggers to generate trigger signals and the rest two groups of triggers to not generate trigger signals at time t3, thereby controlling the corresponding IGBT modules and obtaining high, medium and low output terminal voltages. Time t1, t2 and t2 appear alternately, forming a trinary voltage pulse power source whose high, medium and low output voltages alternate. Under the teaching of the above embodiments, those skilled in the art can easily learn how to divide the triggers into multiple groups and realize pulse output with multiple voltages alternating.

Although FIG. 3 illustrates an example of the high voltage pulse modulating power source according to the present invention, various changes can be made to FIG. 3. The solid-state pulse modulating power source based on the MARX generator as shown in FIG. 3 is merely one way of realizing the high voltage pulse modulating power source. In fact, the present invention can be applied to any trigger-based high voltage pulse modulating power source. In addition, the solid-state switch in the high voltage pulse modulating power source is not limited to the IGBT (Insulating Gate Bi-polar Transistor) solid-state switch, but it can be any device or means that is suitable to serve as a solid-state switch.

Figure 4:
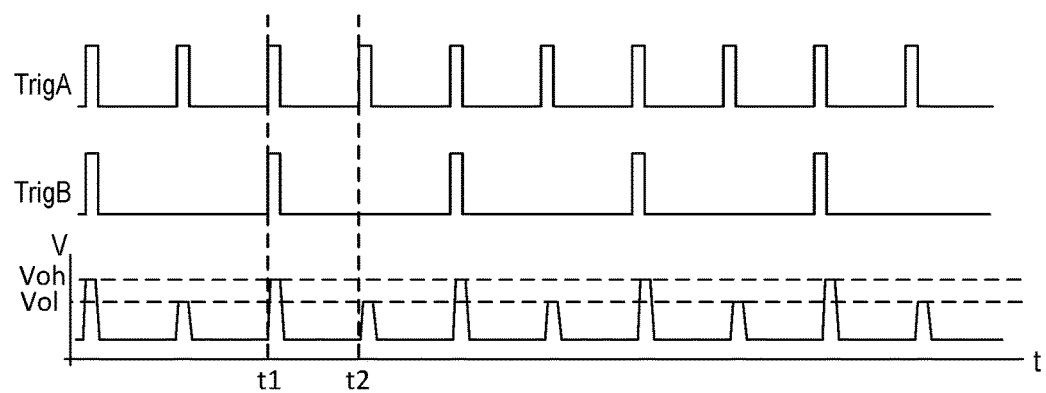
FIG. 4 is a schematic drawing of the work schedule of the high voltage pulse modulating power source according to one embodiment of the present invention.

FIG. 4 is a schematic drawing of the work schedule of the high voltage pulse modulating power source according to one embodiment of the present invention. Triggers 1~m are divided into two groups, i.e. triggers 1~n and triggers n+1~m. When the trigger time t1 comes, a trigger signal TrigA is generated, and the IGBT modules M1~Mm corresponding to all triggers 1~m in the high voltage pulse modulating power source are triggered simultaneously by the trigger signal TrigA, thus obtaining a high output terminal voltage Voh. When the trigger time t2 comes, a trigger signal TrigB is generated, and the IGBT modules M1~Mn corresponding to the first group of triggers 1~n in the high voltage pulse modulating power source are triggered by trigger signal TrigB, while the rest of the IGBT modules Mn+1~Mm are not triggered, thus obtaining low output terminal voltage Voh, or the IGBT modules Mn+1~Mm in the M high voltage pulse modulating power sources, which are corresponding to the second group of triggers n+1~m, are triggered by trigger signal TrigB, while the rest of the IGBT modules M1~Mn are not triggered, thus obtaining a low output terminal voltage Voh' (not shown).

Figure 5:
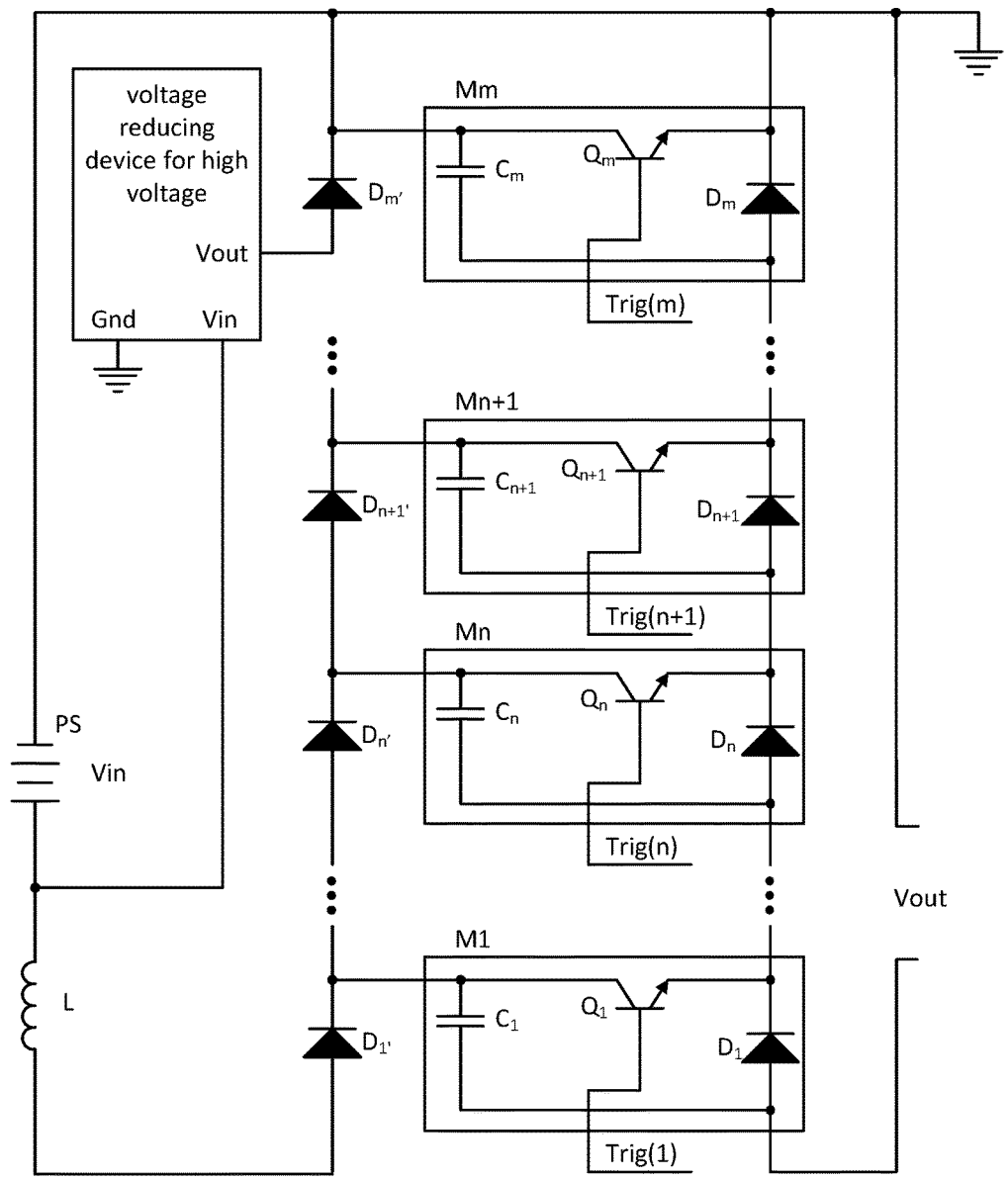
FIG. 5 is a schematic drawing of the principle of the high voltage pulse modulating power source according to a preferred embodiment of the present invention.

FIG. 5 is a schematic drawing of the principle of the high voltage pulse modulating power source according to a preferred embodiment of the present invention. When in the high voltage pulse modulating power source based on the MARX generator, the number of the IGBT modules is small or the requirement on the precision of the alternately outputted voltage is high, in order to precisely control the output terminal voltages Voh and Vol, a voltage reducing device is added to the high voltage pulse modulating power source shown in FIG. 3. As a preferred embodiment, the high voltage pulse modulating power source shown in FIG. 5 has alternate dual voltage output. A is voltage reducing device is added in said modulating power source, which separately supplies power to, for example, the $m^{th}$ IGBT modular unit. As shown in FIG. 5, said voltage reducing device receives an input voltage Vin from a high power DC stabilized voltage source, and supplies input voltage Vin' to the $m^{th}$ IGBT modular unit after a voltage reducing processing.

In this preferred embodiment, triggers 1~m are divided into two groups, i.e. triggers 1~n and triggers n+1~m. At time t1, the time sequence control module controls triggers 1~m to generate trigger signals Trig(1)~Trig(m) simultaneously, so that two groups of IGBT modules M1~Mm corresponding to two groups of triggers are triggered simultaneously, wherein IGBT module Mm has its power supplied separately by the voltage reducing device so as to obtain a high output terminal voltage Voh:

$$Voh=(m-1)*Vin+Vin'.$$

At time t2, the time sequence control module controls the first group of triggers 1~n to generate a first group of trigger signals Trig(1)~Trig(n) and controls the second groups of triggers n+1~m to not generate trigger signals, so that the first group of IGBT modules M1~Mn corresponding to the first group of trigger signals Trig(1)~Trig(n) are triggered, while the second group of IGBT modules Mn+1~Mm corresponding to the second group of triggers n+1~m are not triggered, thus obtaining a low output terminal voltage Vol:

$$Vol=n*Vin.$$

Alternatively, at time t2, the time sequence control module controls the second group of triggers n+1~m to generate a second group of trigger signals Trig(n+1)~Trig(m), and controls the first group of triggers 1~n to not generate trigger signals, so that the first group of IGBT modules M1~Mn corresponding to the first group of trigger signals Trig(1)~Trig(n) are not triggered, while the second group of IGBT modules Mn+1~Mm corresponding to the second group of triggers n+1~m are triggered, wherein IGBT module Mm has its power supplied separately by the voltage reducing device so as to is obtain a low output terminal voltage vol':

$$Vol'=(m-n-1)*Vin+Vin'.$$

Time t1 and time t2 appear alternately, forming a dual voltage pulse power source whose output voltage Voh alternates with Vol or with Vol'.

By adjusting the voltage reducing device to supply input voltage Vin' separately for the $m^{th}$ IGBT modular unit, the output voltage Voh and Vol or Vol' can be controlled precisely.

In other preferred embodiments, the voltage reducing device can separately supply power for any one or more of the m IGBT modular units so as to precisely control the output voltage.

In summary, by means of outputting voltage alternating pulse through alternate group triggering as provided by the present invention, a single-energy accelerator can be used for realizing double (multiple)-voltage alternating output.

Although for the purpose of presenting the basic structure of the present invention, some constructions of the structure have been described, those skilled in the art shall understand that other variations that still fall within the scope of the appended claims are possible. Although the present invention has been described according to the embodiments that have been considered to be the most practical and preferred at present, it shall be understood that the present invention is not limited to the disclosed embodiments, on the contrary, it intends to cover various modified and equivalent solutions that fall into the spirit and scope of the appended claims.

What is claimed is:

1. A high voltage pulse modulating power source based on alternate group triggering, which comprises:
a plurality of modules, each module comprising a capacitor and a solid-state switch, each solid-state switch being controlled by a corresponding trigger signal, the solid-state switch operable to connect the module's capacitor in series with an adjacent module to create a discharging loop having at least one capacitor connected in series across output terminals of the high voltage pulse modulating power source to provide an output voltage;
a DC stabilized voltage source for supplying power at a first voltage level to some of the plurality of modules;
a voltage reducing device for supplying power at an adjustable second voltage level to others of the plurality of modules by reducing a voltage at the first voltage level produced by the DC stabilized voltage source; and
a time sequence control module for providing to each of the plurality of modules a corresponding trigger signal, wherein, at a first time t1, the solid-state switch of each module of a first subset of the plurality of modules is turned on simultaneously, and, at a second time t2, the solid-state switch of each module of a second subset of the plurality of modules is turned on simultaneously.

2. The high voltage pulse modulating power source according to claim 1, wherein, when the solid-state switch is turned off, the module's capacitor is connected for parallel charging and when the solid-state switch is turned on, the module's capacitor is connected for series discharging.

3. The high voltage pulse modulating power source according to claim 2, wherein the high voltage pulse modulating power source is a solid-state pulse modulating power source based on a MARX generator.

4. The high voltage pulse modulating power source according to claim 1, wherein the high voltage pulse modulating power source is a solid-state pulse modulating power source based on a MARX generator.

5. The high voltage pulse modulating power source according to claim 4, wherein the solid-state switch is an IGBT module.

6. A method for alternate group triggering of a high voltage pulse modulating power source, the high voltage pulse modulating power source comprising a plurality of modules, each module comprising a capacitor and a solid-state switch, each solid-state switch being controlled by a corresponding trigger signal, the solid-state switch operable to connect the module's capacitor in series with an adjacent module to create a discharging loop having at least one capacitor connected in series across output terminals of the high voltage pulse modulating power source to provide an output voltage, the method comprising the steps of:
providing, from a DC stabilized voltage source, power at a first voltage level to some of the plurality of modules;
providing, from a voltage reducing device for reducing a voltage at the first voltage level produced by the DC stabilized voltage source, power at an adjustable second voltage level to others of the plurality of modules;
providing, at a first time t1, trigger signals to simultaneously turn on the solid-state switch of each module of a first subset of the plurality of modules; and providing, at a second time t2, trigger signals to simultaneously turn on the solid-state switch of each module of a second subset of the plurality of modules;

wherein the first time t1 and the second time t2 appear alternately.

7. The method according to claim 6, wherein, when the solid-state switch is turned off, the module's capacitor is connected for parallel charging and when the solid-state switch is turned on, the module's capacitor is connected for series discharging.

8. The method according to claim 7, wherein the high voltage pulse modulating power source is a solid-state pulse modulating power source based on a MARX generator.

9. The method according to claim 6, wherein the high voltage pulse modulating power source is a solid-state pulse modulating power source based on a MARX generator.

10. The method according to claim 9, wherein the solid-state switch is an IGBT module.

* * * * *